US010002758B2

(12) United States Patent
Moore

(10) Patent No.: US 10,002,758 B2
(45) Date of Patent: Jun. 19, 2018

(54) COMPOSITIONS AND METHODS OF RINSABLE PRIMERS USED TO AID IN THE REMOVAL OF TEMPORARY FUNCTIONAL COATINGS

(71) Applicant: John Cleaon Moore, Camirillo, CA (US)

(72) Inventor: John Cleaon Moore, Camirillo, CA (US)

( * ) Notice: Subject to any disclaimer, the term of this patent is extended or adjusted under 35 U.S.C. 154(b) by 335 days.

(21) Appl. No.: 14/433,754

(22) PCT Filed: Oct. 10, 2013

(86) PCT No.: PCT/US2013/064259
§ 371 (c)(1),
(2) Date: Apr. 6, 2015

(87) PCT Pub. No.: WO2014/059094
PCT Pub. Date: Apr. 17, 2014

(65) Prior Publication Data
US 2015/0279666 A1 Oct. 1, 2015

Related U.S. Application Data

(60) Provisional application No. 61/713,383, filed on Oct. 12, 2012.

(51) Int. Cl.
*H01L 21/02* (2006.01)
*C11D 11/00* (2006.01)
*H01L 21/311* (2006.01)
*H01L 21/683* (2006.01)
*B08B 3/04* (2006.01)
*C09D 5/00* (2006.01)
*H01L 21/027* (2006.01)
*H01L 23/00* (2006.01)

(52) U.S. Cl.
CPC .......... *H01L 21/02304* (2013.01); *B08B 3/04* (2013.01); *C09D 5/008* (2013.01); *C11D 11/0047* (2013.01); *H01L 21/02041* (2013.01); *H01L 21/0273* (2013.01); *H01L 21/31133* (2013.01); *H01L 21/6835* (2013.01); *H01L 24/83* (2013.01); *H01L 2221/6834* (2013.01)

(58) Field of Classification Search
CPC ................................. G03F 7/00; B32B 27/30
USPC ........................................ 430/270.1; 428/447
See application file for complete search history.

(56) References Cited

U.S. PATENT DOCUMENTS 6,231,990 B1 * 5/2001 Lin ....................... C09D 183/04
156/329
7,695,890 B2 * 4/2010 Zhong ................... G03F 7/0382
430/270.1
2002/0041948 A1 * 4/2002 Shibata ................. C09B 23/083
428/64.4

OTHER PUBLICATIONS

Malhorta et al., Use of silane-based primer on silicon wafers to enhance adhesion of edge-protective coatings during wet etching: Application of the TALON Wrap process, 2007, Proceedings of SPIE, VOl. 6462.*

* cited by examiner

*Primary Examiner* — Dah-Wei D Yuan
*Assistant Examiner* — Andrew Bowman

(57) ABSTRACT

Compositions and methods that use rinsable primers for the removal of temporary functional coatings from substrates, for example, electronic devices, are provided. Methods are provided which discuss the use of rinsable primers to aid the removal of temporary functional coatings that include photoresist, dielectrics, adhesives, and other related materials used in temporary manufacturing applications. These compositions and methods are particularly suitable for removing temporary adhesives used in the manufacture of semiconductors and flat panel displays.

18 Claims, No Drawings

COMPOSITIONS AND METHODS OF RINSABLE PRIMERS USED TO AID IN THE REMOVAL OF TEMPORARY FUNCTIONAL COATINGS

CROSS-REFERENCE TO RELATED APPLICATION

This application claims the benefit of U.S. Provisional Application No. 61/713,383, filed Oct. 12, 2012.

FIELD OF THE INVENTION

The present invention relates generally to the use of a thin rinsable primer underlying a temporary functional coating, whereby the primer's washing ability aids in the removal of the coating from a substrate following the completion of a manufacturing process. In particular, the present invention relates to thin polymeric films that act as barriers to the interaction of a temporary overlying coating with the substrate and subsequently aiding the washing-off (removal) of the temporary overlying coating or film such as photoresist, adhesive, or other related coatings used in the manufacture of electronic devices such as semiconductors and flat panel displays.

BACKGROUND OF THE INVENTION

Compositions of thin coatings and their applications as barriers that prevent the temporary functional coatings to interact with the substrate and subsequently acting as rinsable primers to achieve cleaning of the overlying coatings are disclosed. A rinsable primer is defined as a thin material that is applied and cured to a substrate underlying a temporary functional coating, whereby upon removal, the rinsable primer achieves improved cleaning. A temporary functional coating is defined as a material that performs work during a defined single or multi-step manufacturing process, including substrate protection, substrate adhesion (e.g. wafer bonding), mechanical support of the substrate, or the masking of specific areas or patterning (e.g. photoresist). Following the completion of a manufacturing process using a thin cured rinsable primer that is present under a temporary functional coating, a common cleaning process is performed with a cleaner for the temporary functional coating and a rinse/wash for the rinsable primer, followed by a drying step. When utilizing the practice of coating with a rinsable primer and following with a cleaning process, a high degree of cleanliness is achieved.

Proper choice is important of candidate rinsable primers to be used in conjunction with a temporary functional coating. A method of choosing the respective rinsable primer and temporary coating is based upon polarity, or the difference between hydrophilic and hydrophobic character between the rinsable primer and functional coating. The polarity of the surface is estimated by ASTM method D2578, *Standard Test Method for Wetting Tension of Polyethylene and Polypropylene Films*. The test is based upon the wetting ability of mixed solutions of 2-ethoxyethanol (dielectric constant=29.6) and formamide (polarity=109). For substrates of low surface energy, only those mixtures that are rich in 2-ethoxyethanol will "wet" and spread onto the surface. As formamide content increases, the polarity of the solution increases and if applied to low energy surfaces, it will not spread, but will "bead-up" or reticulate onto the surface and become repelled by the substrate. Therefore, the ASTM method D2578 offers a quick measure of the ability to wet and assess the surface energy of the substrate. The measurement is made in units of dynes/cm2. Material coatings of low surface energy (i.e. <35 dynes/cm2) are classified as more hydrophobic (water hating, repelling), whereas those with properties classified as hydrophilic (water loving, attracting) exhibit higher surface energy (i.e. >55 dynes/cm2). Coatings that widely differ in surface energy are observed to differ in their hydrophilic/phobic and dielectric properties. Surfaces with widely differing character in these areas are expected to act as good choices of rinsable primers and temporary functional coatings for each other.

Once a temporary functional coating has completed its objective, a common cleaning process is performed to remove it and return the substrate to a pristine clean state. Cleaning processes involve direct contact of the cleaning solution to the functional coating, allowing dissolution to occur followed by a rinse and a dry. Electronic substrates must exhibit a high degree of cleanliness in order to allow subsequent manufacturing processes to occur.

SUMMARY OF THE INVENTION

Certain functional coatings contain impurities known to remain as a residue after cleaning. Depending upon the polymer system, the impurity produces a residue that is difficult or impossible to dissolve and remove. Examples of substances containing such impurities include rubber-based polymers. Rubber-like products exhibit long-chain molecules of non-polar character derived from Ziegler-Natta or cationic polymerization, for example, producing high molecular weight polyethylene (HMWPE) and polyisobutylene (PIB), respectively. These polymerization processes produce the desired polymers with trace levels of highly crosslinked species or "gels". Although the cleaning of HMWPE and PIB polymers may be done with hydrocarbon solvents, there remains the presence of residual gels. Gel species from HMWPE and PIB are extremely difficult or impossible to remove by conventional cleaning processes. A material and/or method is needed to improve the cleaning of functional coatings that contain impurities, such as gel species in HMWPE and PIB polymers.

Certain substrates and processes encourage crosslinking of the functional coatings, especially those composed of reactive polymeric materials. Substrates known to catalyze and crosslink polymers include silicon, copper, steel, and other reactive metals. Polymers used as functional coatings which crosslink on reactive substrates will increase in density, become more rigid, and change their properties such that they are more resistant to removal and cleaning. Coatings with a higher resistance to cleaning will leave residue, causing irregularities to subsequent processing. A material and/or method is needed to improve the cleaning of functional coatings used in conjunction with reactive substrates.

Certain functional coatings will crosslink when exposed to excessive thermal and/or oxidative conditions, and ultraviolet (UV) light. When crosslinking occurs, the reaction often undergoes a chemical interaction with the substrate such that it achieves a high density form that is difficult or impossible to remove. Crosslinked functional coatings that are designed to be temporary will increase in challenge the ability to remove all remaining residue after a cleaning process is conducted. Residues remaining will reduce the quality of subsequent processing. A material and/or method is needed to improve the cleaning of crosslinked functional coatings as a result of exposure to excessive thermal and/or oxidative conditions, and UV light.

When it becomes necessary to apply a temporary coating, the means and methods for its removal become highest priority. An option for removing a temporary functional coating includes the application of a rinsable primer. When the rinsable primer and functional coating are similar in polarity, there exists the potential for the systems to comingle and mix during their application. Mixing of the primer and coating produce insufficient separation and defeat the purpose of a segregated washing capacity. Although the temporary functional coating may appear to be smooth and with a high degree of integrity, observation of its mixing with the underlying rinsable primer may exist and go undetected. As a result, insufficient cleaning of the coating remains a problem. Materials and/or methods of application that maintain chemical separation between the rinsable primer and functional coating are desired. The rinsable primer must be applied in such a manner that it exhibits sufficient polarity difference from that of the functional coating. When a polarity difference is achieved, mixing between the rinsable primer and functional coating is minimized, and cleaning is allowed to proceed as planned.

Primer chemistries that exhibit rinsable final forms following a reaction are included for consideration. Such rinsable primers include water-soluble systems as n,n-dimethylacrylamide (DMAA). This acrylic system is known to crosslink due to thermal and/or oxidative conditions, yet the final form is completely soluble in water. Crosslinked rinsable primer chemistries offer unique alternative means to provide differential chemical character between it and the temporary functional coating. It is a desire to provide a rinsable primer chemistry which may be applied and cured by a range of mechanisms, yet maintain differential hydrophilic/phobic character to that of the temporary functional coating sufficient to segregate the chemistry of both layers and minimize mixing, and achieve satisfactory cleaning.

DETAILED DESCRIPTION OF THE INVENTION

It is an object of this invention to provide a composition of matter that operates as a rinsable primer by applying and curing as a thin coating onto a substrate underlying a functional coating, whereby upon its removal, the temporary functional coating is removed and a high degree of cleanliness is achieved. This object and other objects which will become apparent from the description which follows, are achieved by the rinsable primer composition of the invention which comprise a mixture of:
  (a) one or more species which upon their application and curing exhibits a sufficiently different polarity to that of the temporary functional coating such that mixing between the layers are minimized and is demonstrated to directly improve removal performance;
  (b) one or more members from the groups consisting of alcohols, amides, esters, ethers, glycol ether esters, glycol ethers, glycols, ketones, lactates, sulfoxides, or water; and,
  (c) one or more surface active agents providing sufficient wetting of the substrate without the production of foam to a level which prohibits sufficient tool performance; wherein,
the components a-c are present at sufficient concentrations, which when mixed together, will produce a system that enables the application of coatings exhibiting desirable properties of a rinsable primer; such a mixture of components would contain item (a) present in the amount of about 0.1 to about 99 wt %, component (b) present in an amount of about 5.0 to 99.5 wt %, and component (c) present in an amount of about 0.01 to about 5.0 wt %. The composition is mixed to produce a uniform system that operates as a rinsable primer, based upon its application and curing to substrates underlying temporary functional coatings, whereby upon removal using conventional cleaning processes, an ultraclean substrate is achieved.

The components identified in the aforementioned categories a-c are present in a system and include preferred species known to provide certain performance values of interest in coating and cleaning practices in manufacturing. These preferred items identified in the listed categories include the following:
  substances that are soluble, dispersible or dissipatible into water, aqueous systems such as detergents, or polar solvents including lower alcohols such as isopropanol (IPA); substances that are soluble, dispersible or dissipatible in another specific diluent that is a non-solvent for the functional coating and is selected from one or more groups consisting of alcohol ethoxylates, bisphenol ethoxylates and propoxylates, alkylbenzene sulfonic acid salts, cellulose acetate phthalate, cellulosic derivatives of alkoxyethyl and hydroxypropyl, copolymers of ethylene and propylene oxide, dendritic polyesters, ethoxylated amines, ethoxylated alcohol salts, ethylene acrylic acid, hydroxy-methacrylates, phosphate esters, polyethylene glycols, polyethylene imine, polyethylene oxides, polyvinyl alcohol, polyvinyl buryral, alkylated polyvinyl pyrolidone, polyvinyl polypyrolidone, copolymers of vinylpyrolidone and vinyl acetate, copolymers of vinylpyrolidone/dimethylaminomethylmethacrylate, copolymers of quaternized vinylpyrolidone/dimethylaminomethylmethacrylate, copolymers of vinylpyrolidone/ dimethylaminompropylmethacrylamide, terpolymer vinylpyrrolidone/vinylcaprolactam/dimethylaminoethylmethacrylate, polystyrene polyvinylpyrrolidone latex, starch, alginate, copolymers of oxazoline, styrene maleic anhydride, sulfonated acrylics, sulfonated polystyrenes, sulfopolyester of the linear or branched formula, rosin acids, and the most preferred polymer polyvinyl pyrolidone (PVP); high molecular weight polymers such as polysulfones, polyethersulfones polyamides, polybenzoxazole, polyamide-imide such as the commercial product from Solvay (Torlon 4000), polybenzimidazole (PBI) polymers with structure as 1,3-dinitrogen heterocycle and repeat unit is benzimidazole represented in items (1) & (2),

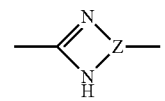

(1)

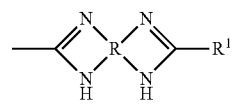

(2)

where —Z— is an arene of mono or poly-nucleus variety having the nitrogen atoms of the benzimidazole ring bond at adjacent locations on the respective arene ring, R is an arene of mono or poly-nucleus variety exhibiting tetravalent character and orienting itself in the ortho direction to bond at adjacent carbon locations on the arene ring with the nitrogen atoms of the benzimidazole rings and substituent R1 may comprise an arene ring, an alkylene having 4-8 carbons, or a heterocyclic ring that includes pyridine, pyrazine, furan, quinoline, thophene, and pyran, the most preferred is poly[2,2'-(m-phenylene)-5,5'-bibenzimidazole], represented in item (3);

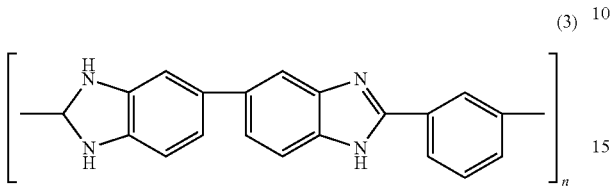
(3)

photochemically reactive acrylate ester monomers by the general formula described in item (4),

(4)

where both R1 and R2 may represent the following: hydrogen (—H), amide (—NH2), methyl (—CH3), hydroxyl (—OH), alcohol (—CH2OH), or any one of the groups represented by the formula —CnH(2n+1) or —CnH(2n)OH where n varies from 2-20; aromatic hydrocarbon functional groups of the formula —C6X5, where X may be substituent groups such as hydrogen (—H), the halogens (—F, —Br, —Cl, —I), hydroxyl (—OH), —COOH; and —COOR3 groups, wherein R3 represents the following: hydrogen (—H), amide (—NH2), methyl (—CH3), hydroxyl (—OH), alcohol (—CH2OH), or any one of the groups represented by the formula —CnH(2n+1) or —CnH(2n)OH where n varies from 2-20. The preferred acrylic monomers are those represented by item (4) with substituent groups which do not unduly hinder or interfere with the photocure of the acrylic monomer, wherein R1 is a hydrogen (—H), or methyl (—CH3), defining the molecule as an acrylate or methacrylate, respectively, and R2 to represent a substituent of the form or —CnH(2n)OH where n varies from 2-20. Such preferred acrylics include hydroxyethyl acrylate (CAS #818-61-1), hydroxypropyl acrylate (CAS #25584-83-2), hydroxyethyl methacrylate (CAS #868-77-9), and hydroxy propyl methacrylate (CAS #27813-02-1), preferred acrylic monomers are those represented by item (4), wherein R1 is a hydrogen (—H), or methyl (—CH3), and R2 to represent a substituent of the form amide (—NH2), including n,n-dimethylacrylamide (DMAA, CAS #2680-03-7); substances that are soluble, dispersible or dissipatible into non-polar hydrocarbon systems such as rubber-based polymers to include natural and synthetic rubbers, latex, ethylene and propylene diene monomers (EPDM), hydrocarbon resins, terpene rosins of moderate to low total acid number (TAN), polyisobutylene (PIB), cyclic olefin copolymer, ethylene norbornene copolymer, styrenic block copolymers including styrene-butadiene-styrene (SBS), styrene-isoprene-styrene (SIS), hydrogenated versions of SBS and SIS, and hydrocarbon soluble reactive silicone monomers having polysiloxane-vinyl and silylhydrate character, including dimethyl terminated dimethye siloxane, a dimethylvinylated silica and dimethyl, methylhydrogen silicone which may be thermochemically crosslinked; alkali or base of organic or inorganic origin to include ammonium hydroxide, quaternary hydroxides, amines, alkanolamines, elemental hydroxides, or alkoxides, alkyl-sulfonic acids, formic acid, fatty acids, sulfuric acid, nitric acid, or phosphoric acids; inhibitors defined as a protecting agents to include chelating and complexing agents, including benzylic hydroxides such as catechol, triazoles such as benzotriazole (BTA) and tolyltriazole (TTA), imidazoles, imidazolines, borates, phosphates, and alkyl or elemental silicates, ethylenediaminetetraacetic acid, diethylenetriaminepentaacetic acid, nitrilotriacetic acid, and 2,4-pentanedione, reducing sugars, hydroquinones, glyoxal, salicylaldehyde, fatty acids such as citric and ascorbic acid, hydroxylamines, or vanillin;

(b) suitable solvents include, but are not limited to ketones such as cyclohexanone, 2-heptanone, methyl propyl ketone, and methyl amyl ketone, esters such as isopropyl acetate, ethyl acetate, butyl acetate, ethyl propionate, methyl propionate, gamma-butyrolactone (BLO), ethyl 2-hydroxypropionate (ethyl lactate (EL)), ethyl 2-hydroxy-2-methyl propionate, ethyl hydroxyacetate, ethyl 2-hydroxy-3-methyl butanoate, methyl 3-methoxypropionate, ethyl 3-methoxy propionate, ethyl 3-ethoxypropionate, methyl 3-ethoxy propionate, methyl pyruvate, and ethyl pyruvate, ethers and glycol ethers such as diisopropyl ether, ethyleneglycol monomethyl ether, ethyleneglycol monoethyl ether, diethylene glycol monoethyl ether and propylene glycol monomethyl ether (PGME), glycol ether esters such as ethyleneglycol monoethyl ether acetate, propyleneglycol methyl ether acetate (PGMEA), and propyleneglycol propyl ether acetate, aromatic solvents such as methylbenzene, dimethylbenzene, anisole, and nitrobenzene, amide solvents such as N,N-dimethylacetamide (DMAC), N,N-dimethylformamide, and N-methylformanilide, and pyrrolidones such as N-methylpyrrolidone (NMP), M-ethylpyrrolidone (NEP), dimethylpiperidone, 2-pyrrole, N-hydroxyethyl-2-pyrrolidone (HEP), N-cyclohexyl-2-pyrrolidone (CHP), sulfur containing solvents such as dimethyl sulfoxide, dimethyl sulfone and tetramethylene sulfone, and most preferred of the solvents include 3-methoxy-3-methyl-1-butanol (MMB), and/or water.

(c) surfactants representing one or more of the known varieties, including fluorinated systems, nonionic nonyl-phenols and nonyl-ethoxylates, anionic forms that include alkyl-sulfonates, phosphate esters, and succinates.

Compositions of the rinsable primer can easily be chosen based upon minimum criteria as 1) is not affected by the carrier solvent or liquid form of the functional coating, 2) exhibits a wide difference in surface energy from that of the functional coating, 3) is thermal and chemically stable during the curing of the functional coating and subsequent process exposure, and 4) exhibits beneficial properties that aid in cleaning Materials examples which benefit cleaning, include water soluble systems, other aqueous chemistries such as acidics that exhibit detergent solubility, isopropanol (IPA) solubility, and/or materials used as a rinse and with the ability to evaporate to dryness without leaving residue.

Examples of rinsable primers are given in Table 1, relative to the chemistry of the functional coating.

TABLE 1

Options for rinsable primers relative to the functional coating.

| Functional Coating & Surface Energy | Casting Solvent | Cure Method | Candidate Rinsable Primers & Surface Energy | Cleaning Agent |
|---|---|---|---|---|
| Rubber (EPDM monomer); <30 dynes/cm2 | Hydrocarbon solvent | Evaporation | PVP -or- DMAA (cured); >60 dynes/cm2 | Water |
| Acrylic (IBOA)*, <40 dynes/cm2 | -none- 100% solids | Radiation cured | DMAA (cured, insoluble in IBOA) -or- rosin (insoluble in IBOA); >60 dynes/cm2 | Water or detergent |

*IBOA = isobornyl acrylate

It is preferred for candidate rinsable primers to exhibit a maximum difference in polarity and surface energy from that of the temporary functional coating. A method of characterizing polarity as surface energy is based upon the application of fluids with known surface energy values in contact with solids, measured in units of dynes/cm2. A simple method for estimating test results following ASTM method D2578, is by using colored ink pens containing fluids with which exhibit specific surface energy values. Many commercial choices exists for the use of colored ink pens that perform screening tests of surface energy (e.g. www.accudynetest.com). Material coatings of low surface energy (i.e. <35 dynes/cm2) are classified as more hydrophobic (water hating, repelling), whereas those with properties classified as hydrophilic (water loving, attracting) exhibit higher surface energy (i.e. >55 dynes/cm2). Coatings that widely differ in surface energy are observed to differ in their hydrophilic/phobic and dielectric properties. Surfaces with widely differing character in these areas are expected to act as good choices of rinsable primers and temporary functional coatings for each other.

The choice of the type and chemistry of the rinsable primer is dependent upon the chemistry of the temporary functional coating. Commonly, the chemistry of the rinsable primer differs with that of the temporary functional coating. This is to prevent intermixing between the primer and coating. Segregation between the primer and coating is needed to maximize cleaning results. One example of a rinsable primer system includes a cleaning solution that removes the functional coating while the rinsing step removes the primer. An example includes the use of PVP (polyvinylpyrrolidone, surface energy >60 dynes/cm2), a water soluble polymer cast from alcohol or water, and the functional coating as PIB (polyisobutylene, surface energy <30 dynes/cm2), a rubber-based functional coating cast from a non-polar solvent (hydrocarbon) system. The PIB is chemically segregated from the PVP, due to neither polymer is soluble in the other's solvent regime. The cleaning process is first conducted with a non-polar hydrocarbon solvent and followed with an IPA rinse. PIB is removed with a hydrocarbon solvent (dissolved in the solvent) while PVP is insoluble in the hydrocarbon, yet is dissolved with IPA during rinsing, leaving the substrate clean and free of residue from the PIB rubber.

Using this approach, a universal process design is applied to a wide variety of customer applications based upon a minimum difference between the functional coating and underlying rinsable primer. The application may be varied, to include substrate protection, adhesion, or photolithography, however, the choice of a rinsable primer is adjusted according to the chemistry of the functional coating. More important, safe cleaning chemistries or simple processes may be chosen over toxic and complex to provide lower cost options in manufacturing. This flexibility is desirable to apply to a wide range of processes and chemistries.

The invention also comprises a method for choosing the rinsable primer and formulating its contents in accordance to the chemistry of the functional coating. The primer is chosen based upon sufficient polarity difference as compared to the functional coating. Once a desired polarity is identified for the rinsable primer, options for casting solvents with similar polarity needed for dissolution are identified and tested against the functional coating. Ideal casting solvent candidates are those that have limited or no effect on the rinsable primer.

The compositions of rinsable primers and methods have particular applicability to semiconductor wafer fabrication, for example, during the removal of temporary adhesives and photoresist from semiconductor wafers. Such organic substances are present, for example, on wafers during back-end wafer-level-packaging and bumping processes. The compositions and methods are particularly suitable for the removal of rubber-based polymers used for temporary bonding applications, and to remove residues from these polymers that are resistant to conventional cleaners.

The terms "stripping", "removing", and "cleaning" are used interchangeably throughout this specification. The terms "stripper", "remover", and "cleaning composition" are used interchangeably. The terms "residues", "contamination", "gels", "residual gels", and "remains" are used interchangeably. The terms "rinsable primer", "rinsable coating", and "primer" are used interchangeably. Likewise, the terms "temporary functional coating", "functional coating", and "temporary coating", are used interchangeably. The indefinite articles "a" and "an" are intended to include both the singular and the plural. All ranges are inclusive and combinable in any order except where it is clear that such numerical ranges are constrained to add up to 100%. The term "wt %" means weight percent based on the total weight of the stripping composition, unless otherwise indicated.

Of particular interest in the use of this invention is to facilitate a rapid removal of residue from the functional coating and rinsable primer without attack (e.g. corrosion) to the underlying substrate, metals, or dielectrics. The substrates include silicon, silicon dioxide, gallium arsenide (GaAs), glass, sapphire, quartz, and the like. Features on the substrate are typically composed of metal such as copper, aluminum, nickel, titanium, and other similar layers with pads, contacts, leads, and solder alloys composed of tin, lead, silver, copper, and similar materials used for conduction. Other materials include dielectrics such as nitrides of silicon, polyimide, polybenzoxazole (PBO), silicone, bis-benzocyclobutene (BCB), and related non-conducting films. This invention teaches the ability to remove a functional coating by the use of a rinsable primer while achieving the desired selectivity needed to protect a wide variety of underlying materials.

EXAMPLES

To a series of silicon wafers and/or glass of a high cleanliness starting condition, different polymers are applied as rinsable primers and cured. Bare silicon wafers with a high polish side for the coating application and without oxide, nitride, or other substrate coatings are preferred. Onto the cured primers, a temporary functional coating, primarily composed of a cyclic olefin copolymer (COC), is coated and cured. The cure program for both the rinsable primers and COC functional coating is the same, namely: 110° C.+150° C.+220° C., 2 min each on a hot plate. Based upon a series of screening measurements, the rinsable primer is <5 um and the functional coating is >10 um. In these experiments, the COC is chosen from Topas Advanced Polymers owned by Ticona/Celanese, currently owned by Daicel Corporation (www.daicel.com). The COC materials chosen include product numbers 6015 and 6017, both exhibiting heat deflection temperatures 150 C or higher.

TABLE 1

Experimental description of primer, functional coating and cleaning process.

| # | Primer | Functional Coating | Cleaner 70° C. for 15 min | Rinse 1 70° C. for 5 min | Rinse 2 |
|---|---|---|---|---|---|
| 1 | PBI* | COC** | Aromatic 150 | DMAC | IPA, RT |
| 2 | Torlon 4000T* (polyamide-imide) | COC** | Aromatic 150 | DMAC | IPA, RT |
| 3 | BTA*:TTA*:H2O, 1.2:0.8:98 | COC** | Aromatic 150 | IPA, RT | None |
| 4 | Armohib B210* (imidazoline), 3% in H2O | COC** | Aromatic 150 | IPA, RT | None |
| 5 | PVP K-15* (polyvinyl pyrrolidone) | COC** | Aromatic 150 | Aqueous detergent | IPA, RT |
| 6 | Aquazol 500* (poly-2-ethyl-oxazoline) | COC** | Aromatic 150 | Aqueous detergent | IPA, RT |
| 7 | Oppanol B100* | COC** | Aromatic 150 | IPA, RT | None |
| B1 | None | None | Aromatic 150 | IPA, RT | None |
| B2 | None | COC** | Aromatic 150 | IPA, RT | None |

PBI* = polybenzimidazole, PBI Performance Products (www.pbiproducts.com)
Torlon 4000T* = polyimideamide, Solvay Specialty Polymers (www.solvay.com)
BTA* & TTA* = benzotriazole & tolyltriazole, available from local supply
Armohib B210* = corrosion inhibitor/surface modifier, tall oil amide, Akzo Nobel, www.akzonobelusa.com
PVP K15* = viscosity of 1% solution based upon MW, International Scientific Products, (www.ispcorp.com)
Aquazol 500* = homopolymer of 2-ethyl oxazoline and MW @ 500,000 g/m, International Scientific Products, (www.ispcorp.com)
Oppanol B100* = polyisobutylene (PIB) MW = 1.1 m, BASF Corporation (www.basf.com)
COC** = cyclic olefin copolymer, P/N 6015 or 6017, Daicel Corporation.

Example #1

Cleaning of the functional coating and rinsable primer includes a solvent specific for the COC functional coating (e.g. Aromatic 150 hydrocarbon solvent, ExxonMobil Chemical www.exxonmobilsynthetics.com) 70° C. 15 min and a rinse solvent specific for the rinsable primer also performed at 70° C. for 5 min. Isopropanol (IPA) is used at room temperature (RT). Please see Table 2 for experimental results.

TABLE 2

Cleaning results of rinsable primer used with functional coating described in Table 1.

| # | Cleaner 70° C. for 15 min | Rinse 1 70° C. for 5 min | Rinse 2 | Results |
|---|---|---|---|---|
| 1 | Aromatic 150 | DMAC* | IPA, RT | Clean |
| 2 | Aromatic 150 | DMAC* | IPA, RT | Clean |
| 3 | Aromatic 150 | IPA, RT | None | No clean |
| 4 | Aromatic 150 | IPA, RT | None | Clean |
| 5 | Aromatic 150 | Aqueous detergent | IPA, RT | Clean |
| 6 | Aromatic 150 | Aqueous detergent | IPA, RT | Clean |
| 7 | Aromatic 150 | IPA, RT | None | No clean |
| B1 | Aromatic 150 | IPA, RT | None | No clean |
| B2 | Aromatic 150 | IPA, RT | None | No clean |

Example #2

Measurement of the surface energy of the rinsable primer and temporary functional coating as described in Table 1. These values are compared with the cleaning results from Table 2. As expected, the comparison of results suggests that successful cleaning is achieved when both surface energy differences exist and no mixing exists between the layers.

TABLE 3

Measurement of surface energy for both coatings and.

| # | Rinsable Primer & Surface Energy (dynes/cm2) | Functional Coating & Surface Energy (dynes/cm2) | Difference in Surface Energy (dynes/cm2) | Functional Coating & Primer Mixing | Cleaning Results |
|---|---|---|---|---|---|
| 1 | PBI, ~58 | COC, <30 | ~28 | No | Clean |
| 2 | Torlon 4000T, >60 | COC, <30 | >30 | No | Clean |
| 3 | BTA:TTA:H2O, >60 | COC, <30 | >30 | Yes | No clean |
| 4 | Armohib B210, >60 | COC, <30 | >30 | No | Clean |
| 5 | PVPK-15, >60 | COC, <30 | >30 | No | Clean |
| 6 | Aquazol 500, >60 | COC, <30 | >30 | No | Clean |
| 7 | Oppanol B100, <30 | COC, <30 | ~0 | Yes | No clean |
| B1 | None, glass >50 | None, glass >50 | ~0 | N/A | No clean |
| B2 | None, glass >50 | COC, <30 | >20 | N/A | No clean |

N/A = not applicable, both coatings are not present

Example #3

The invention is demonstrated with an acrylic transfer tape as a temporary top coat using a rinsable primer to ensure final cleaning is complete when the top coat is removed. A rosin-based coating is used for the rinsable primer, using alkaline detergent for removal.

TABLE 3

Results of cleaning efforts using invention rinsable primer as a rosin and an acrylic transfer tape as functional coating. Cleaning is based upon a dilute alkaline detergent @ 70 C., 15 min, water rinse, IPA dip and dry.

| # | Rinsable Primer, Mftr | Functional Coating, Mftr | Cleaning |
|---|---|---|---|
| 1 | Filtrez 591, Lawter* | Adwill, Lintec | Clean |

TABLE 3-continued

Results of cleaning efforts using invention rinsable primer
as a rosin and an acrylic transfer tape as functional coating.
Cleaning is based upon a dilute alkaline detergent @ 70
C., 15 min, water rinse, IPA dip and dry.

| # | Rinsable Primer, Mftr | Functional Coating, Mftr | Cleaning |
|---|---|---|---|
| 2 | Filtrez 591, Lawter* | SP-537T-160, Furukawa | Clean |
| 3 | Filtrez 591, Lawter* | UC-353EP-110A, Furukawa | Clean |
| 4 | Filtrez 591, Lawter* | SP-537T-230, Furukawa | Clean |
| 5 | Filtrez 591, Lawter* | -none- | Clean |
| 6 | -none- | SP-537T-230, Furukawa | Not Clean |

What is claimed is:

1. A process of achieving clean substrates when using a temporary functional coating (top layer) comprising,
   (a) applying a rinsable primer composition (bottom layer) and curing to the substrate;
   (b) applying a temporary functional coating (top layer) over said rinsable primer composition (bottom layer) and completing the process for the purpose of said temporary functional coating (top layer);
   (c) cleaning and removal of the temporary functional coating (top layer) from the substrate using a sufficient chemical reagent, and
   (d) rinsing with a rinsing agent sufficient to remove the rinsable primer composition (bottom layer) and the temporary functional coating, wherein there is
      (i) a rinsable primer composition (bottom layer) which completely dissolves during the rinsing step of the cleaning process;
      (ii) a thickness of the rinsable primer composition, bottom layer, of 100 microns or less;
      (iii) a surface energy difference between the two layers of 50 dynes/cm2 or less, and
      (iv) a mixing of 90% or less between the two layers when they are applied;
   (e) continuing with electronic device manufacturing with no further rinsing step for residue removal needed wherein all primer is removed.

2. The process of claim 1, wherein the thickness of the rinsable primer composition is 50 microns or less.

3. The process of claim 2, wherein the thickness of the rinsable primer composition is 10 microns or less.

4. The process of claim 1, wherein the surface energy difference between the rinsable primer composition and temporary functional coating is 30 dynes/cm2 or less.

5. The process of claim 1, wherein the mixing between the two layers is 50% or less.

6. The process of claim 5, wherein the mixing between the two layers is 20% or less.

7. The process of claim 1 wherein the rinsable primer composition comprises at least one material.

8. The process of claim 7, wherein the rinsable primer composition is one or more compounds with the property of water solubility determined to be at or greater than 10 weight % concentration (i.e. polymer in water) as determined by ASTM method E1148 (2008) or is soluble by neutralization with an aqueous acid or base to form a water soluble conjugate.

9. The process of claim 7, wherein the rinsable primer composition comprises one or more compounds selected from alcohol ethoxylates, bisphenol ethoxylates and propoxylates, alkylbenzene salts, cellulose acetate phthalate, phthalic acid, cellulosic derivatives of alkoxyethyl and hydroxypropyl, copolymers of ethylene and propylene oxide, dendritic polyesters, ethoxylated amines, ethoxylated alcohol salts, ethylene acrylic acid, hydroxy-methacrylates, phosphate esters, polyethylene glycols, polyethylene imine, polyethylene oxides, polyvinyl alcohol, polyvinyl pyrollidinone, starch, styrene maleic anhydride, sulfonated acrylics, sulfonated polystyrenes, sulfopolyester of the linear or branched formula, rosin acids, and inorganic salts.

10. The process of claim 7, wherein the rinsable primer composition is one or more organic compounds exhibiting a solvent solubility at 10 weight % or greater concentration into either polar or non-polar hydrocarbon solvents.

11. The process of claim 10, wherein the rinsable primer composition is one or more compounds selected from rubber-based polymers to include natural and synthetic rubbers, latex, ethylene and propylene diene monomers (EPDM), hydrocarbon resins, terpene rosins of moderate to low total acid number (TAN), polyisobutylene (PIB), cyclic olefin copolymer, ethylene norbornene copolymer, styrenic block copolymers including styrene-butadiene-styrene (SBS), styrene-isoprene-styrene (SIS), hydrogenated versions of SBS and SIS, and hydrocarbon soluble reactive silicone monomers having polysiloxane-vinyl and silyl hydrate character, including dimethyl terminated dimethyl siloxane, a dimethyl vinylated silica and dimethyl, methyl hydrogen silicone which may be thermochemically crosslinked, inhibitors defined as a protecting agents to include chelating and complexing agents, including benzylic hydroxides such as catechol, triazoles such as benzotriazole (BTA) and tolyl triazole (TTA), imidazoles, borates, phosphates, and alkyl or elemental silicates, ethylenediaminetetraacetic acid, diethylenetriaminepentaacetic acid, nitrilotriacetic acid, and 2,4-pentanedione, reducing sugars, hydroquinones, glyoxal, salicylaldehyde, fatty acids such as citric and ascorbic acid, hydroxylamines, or vanillin.

12. The process of claim 1 used in the manufacture of microelectronic devices wherein the temporary functional coating (top layer) is a protective layer over the substrate.

13. The process of claim 12 used in the manufacture of microelectronic devices where the temporary functional coating (top layer) is an adhesive for substrate bonding.

14. The process of claim 13 used in the manufacture of microelectronic devices where the temporary functional coating (top layer) is a photoresist for substrate patterning.

15. The process of claim 14, further comprising a drying step.

16. The process of claim 15, wherein the drying step is a physical drying step, a chemical drying step, or a combination thereof.

17. The process of claim 16, wherein the process includes the application of megasonics during the rinsing step to improve the extraction and mixing efficiency of these steps.

18. The process of claim 17, wherein the rinsing step is followed by another rinse in water, acetone, or isopropyl alcohol.

* * * * *